US006812434B2

(12) United States Patent
Yamaguchi

(10) Patent No.: US 6,812,434 B2
(45) Date of Patent: Nov. 2, 2004

(54) CERAMIC HEATERS, A METHOD FOR PRODUCING THE SAME AND HEATING APPARATUSES USED FOR A SYSTEM FOR PRODUCING SEMICONDUCTORS

(75) Inventor: Shinji Yamaguchi, Ama-Gun (JP)

(73) Assignee: NGK Insulators, Ltd., Nagoya (JP)

(*) Notice: Subject to any disclaimer, the term of this patent is extended or adjusted under 35 U.S.C. 154(b) by 67 days.

(21) Appl. No.: 10/274,689

(22) Filed: Oct. 21, 2002

(65) Prior Publication Data

US 2003/0094447 A1 May 22, 2003

(30) Foreign Application Priority Data

Nov. 19, 2001 (JP) ........................................ P2001-352964

(51) Int. Cl.⁷ ................................................. H05B 3/68
(52) U.S. Cl. ............................... 219/444.1; 219/448.11
(58) Field of Search .......................... 219/443.1, 444.1, 219/448.11, 465.1, 468.1, 468.2, 543, 544, 546, 547, 148; 118/724, 725; 29/610.1, 611

(56) References Cited

U.S. PATENT DOCUMENTS

| | | | | |
|---|---|---|---|---|
| 5,817,156 A | * | 10/1998 | Tateyama et al. | 29/25.01 |
| 5,927,077 A | * | 7/1999 | Hisai et al. | 62/3.3 |
| 6,376,808 B2 | * | 4/2002 | Tachikawa et al. | 219/444.1 |
| 6,465,763 B1 | * | 10/2002 | Ito et al. | 219/444.1 |

FOREIGN PATENT DOCUMENTS

JP     6-53145     2/1994

* cited by examiner

Primary Examiner—Sang Paik
(74) Attorney, Agent, or Firm—Burr & Brown

(57) ABSTRACT

A ceramic heater is provided, including a ceramic substrate with a heating face and a heat generator so that the temperature on the heating face may be controlled without a temperature controlling member that is separate from the substrate. The surface of the ceramic substrate includes a heating face, a first region provided apart from the heating face and a second region provided apart from the heating face. The second region has a lower emissivity of thermal radiation than that of the first region.

24 Claims, 11 Drawing Sheets

(a)

(b)

(a)

(b)

(a)

(b)

US 6,812,434 B2

CERAMIC HEATERS, A METHOD FOR PRODUCING THE SAME AND HEATING APPARATUSES USED FOR A SYSTEM FOR PRODUCING SEMICONDUCTORS

This application claims the benefit of Japanese Patent Application P2001-352964, filed on Nov. 19, 2001, the entirety of which is incorporated by reference.

FIELD OF THE INVENTION

The present invention relates to ceramic heaters, a process for producing the same, and heating apparatuses for a semiconductor producing system.

BACKGROUND OF THE INVENTION

In a semiconductor producing system, a ceramic heater has been provided for heating a wafer (substrate) so as to deposit a semiconductor thin film on the wafer from gaseous raw materials such as silane gas by means of thermal CVD or the like. In such a heater, it is necessary to maintain a high temperature on a heating face and to assure the temperature uniformity on the heating face so as to prevent semiconductor defects. Such a ceramic heater, however, is generally made of a ceramic substrate and a heat generator embedded in the substrate, so that some degree of temperature difference may be observed on the heating face.

Japanese patent publication 6-53, 145 A discloses a technique for improving the temperature uniformity on the semiconductor heating face of a ceramic heater. That is, a disk-shaped ceramic heater with a heating face for a heating semiconductor is produced. The temperature distribution on the heating face is then observed with a thermograph. The thus observed temperature distribution is then subjected to image processing to obtain image-processed data. A reflector is provided on a position opposing the back face of the ceramic heater. The heat that is radiated from the back face of the ceramic heater is reflected by the reflector and irradiated into the heater again. The temperature distribution of the reflector is controlled based on the image-processed data. In the region where a lower temperature is observed on the heating face, the thermal absorptance of the reflector is reduced, so that the heat reflected by the reflector into the heater may be increased. The temperature in the region with the lower temperature observed may be thus increased. The surface of the reflector is subjected to sandblasting to control the surface roughness and thus to control the reflectance of the reflector.

The inventor has studied the above technique in Japanese patent publication 6-53, 145 A and encountered the following problems. That is, it is necessary to fix a reflector in a specific position opposing the back surface of the ceramic heater in the semiconductor chamber. After fixing the reflector, the distribution of the thermal absorptance (or thermal reflectance) on the reflecting face of the reflector should be accurately matched with the temperature distribution on the heating face of the ceramic heater before fixing the reflector. It is difficult, however, to adjust the positions of the heating face of the heater and of the reflecting face of the reflector for the following reasons:

(1) The center of a circular heating face of the ceramic heater should be accurately matched with the center of the circular reflecting face of the reflector; and (2) In addition to this, the angle and diameter of each position of the heating face with respect to the center should be accurately matched with those of each position of the reflecting face with respect to the center.

Furthermore, even if such a two dimensional position adjustment is successfully performed, such an adjustment is insufficient for obtaining temperature uniformity on the heating face within specification for the following reasons. That is, the distance between the back face of the heater and the reflecting face of the reflector is also important. Specifically, the thermal absorptance of each point on the reflecting face is calculated and designed on the provision that a distance between the reflecting face and the back face of the heater is a specific value "$\alpha$." When the distance between the reflecting face and back face is smaller than "$\alpha$," heat transmitted from the reflecting face to the back face of the heater is increased so that the temperature on the heating face of the heater may be increased. The following adjustments (3) and (4) are thus needed:

(3) the distance between the back face of the heater and the reflecting face of the reflector must be controlled to a specific value "$\alpha$;" and (4) the back face of the heater and the reflecting face must be parallel with each other over the whole of the back face.

It is difficult to set and fix the reflector in a semiconductor chamber while maintaining the above four geometrical conditions. Furthermore, the fixed reflector may result in a complicated structure, and the reflector may be deteriorated, fractured or warped due to thermal stress which produces adverse effects on the gas flow.

SUMMARY OF THE INVENTION

An object of the present invention is to provide a novel ceramic heater having a ceramic substrate with a heating face and a heat generator so that the temperature on the heating face may be controlled without the necessity of a temperature controlling member that is separate from the substrate.

The present invention provides a ceramic heater having a heat generator and a ceramic substrate with a surface including a heating face. A first region is provided on the surface and out of the heating face, and a second region is provided on the surface and out of the heating face. The second region has a lower emissivity of thermal radiation than that of the first region.

The present invention further provides a heating apparatus for a system for producing semiconductors. The heating apparatus includes a ceramic heater with a back face, a terminal connected with a generator, a hollow supporting member defining an inner space and fixed on the back face of the heater, and a power supply means provided in the inner space and electrically connected with the terminal.

A semiconductor producing system means a system usable in a wide variety of semiconductor processes in which metal contamination of a semiconductor is to be avoided. Such a system includes film forming, etching, cleaning and testing systems.

The present invention also provides a method for producing a ceramic heater having a heat generator and a ceramic substrate with a surface including a heating face. The method includes the step of providing a first region and a second region both on the surface and out of the heating face. The second region has a lower emissivity of thermal radiation than that of the first region.

The inventor has tried to divide the surface of the ceramic substrate itself, other than the heating face, into a plurality of regions having the different thermal emissivities with respect to each other. The inventor has thus studied the effects on the heating face of the substrate. As a result, the inventor has found that the temperature uniformity on the heating face may be substantially affected beyond expectation. The present invention is based on these findings.

For example, when a cold spot is observed on a heating face of a ceramic substrate, the emissivity of thermal radiation may be reduced in a projected area defined by projecting a planar pattern of the cold spot onto the back face. It is thereby possible to slightly increase the temperature in the cold spot on the heating face so that the cold spot may be cancelled. Alternatively, when a hot spot is observed on a heating face of a ceramic substrate, the emissivity of thermal radiation may be increased in a projected area defined by projecting a planar pattern of the hot spot onto the back face. It is thereby possible to slightly reduce the temperature in the hot spot on the heating face so that the hot spot may be cancelled. Such changes or control of the emissivity of thermal radiation of a part of the surface of the ceramic substrate may be performed only with surface processing of the ceramic surface. It has not been known that the temperature distribution on the heating face may be considerably improved only by performing surface processing of the ceramic substrate to control the emissivity of thermal radiation.

These and other objects, features and advantages of the invention will be appreciated upon reading the following description of the invention when taken in conjunction with the attached drawings, with the understanding that some modifications, variations and changes of the same could be made by the skilled person in the art.

BRIEF DESCRIPTION OF THE DRAWINGS

FIG. 2(a) is a plan view showing the ceramic heater 1 observed from the side of heating face 2a.

FIG. 2(b) is a cross sectional view showing a proximal part of a side face 2c of the heater 1.

DETAILED DESCRIPTION OF THE INVENTION

The present invention will be described further in detail, referring to the attached drawings. In the embodiment shown in FIGS. 1 to 7, the center line average surface roughness of a ceramic substrate is controlled so as to control the emissivity of thermal radiation. That is, as the center line average surface roughness "Ra" of a ceramic surface increases (e.g., as the ceramic surface is made rougher), the emissivity of thermal radiation of the surface is slightly increased. On the other hand, as the center line average surface roughness "Ra" of a ceramic surface decreases (e.g., as the ceramic surface is made smoother), the emissivity of thermal radiation of the surface is slightly reduced.

Figure 1:
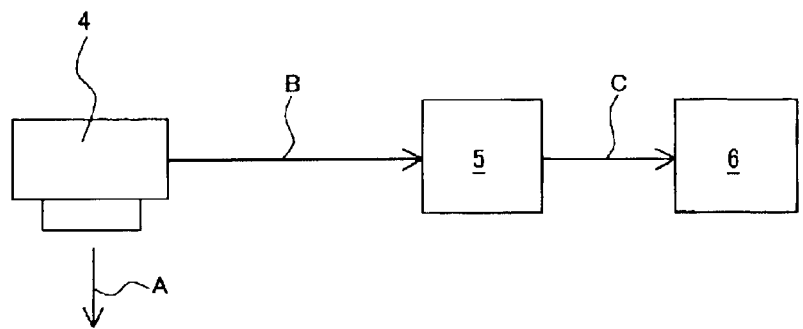
FIG. 1 is a schematic diagram for explaining a method for measuring the temperature distribution on a heating face 2a of a ceramic heater 1.
Figure 1:
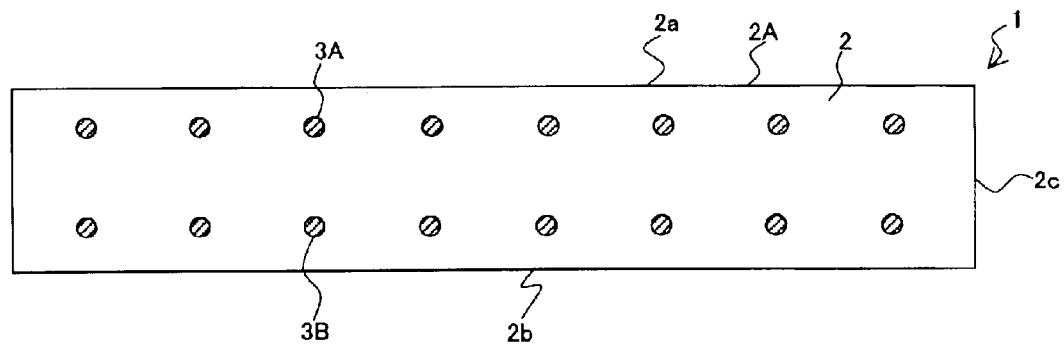
Figure 2:
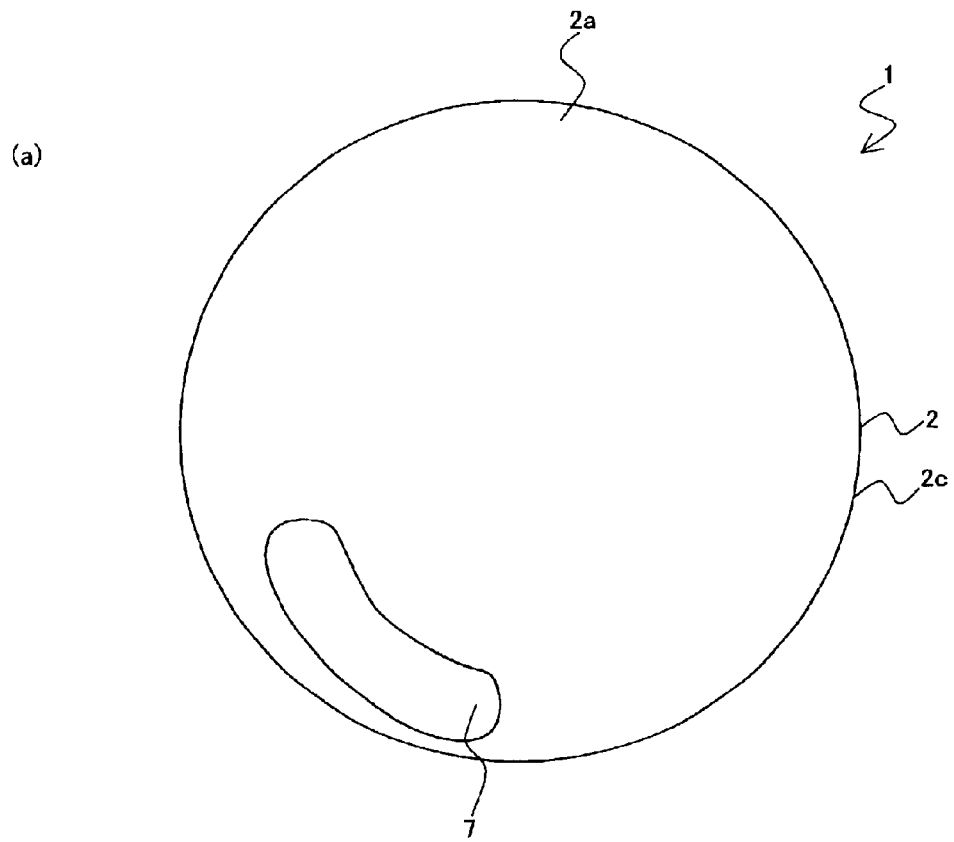
Figure 2:
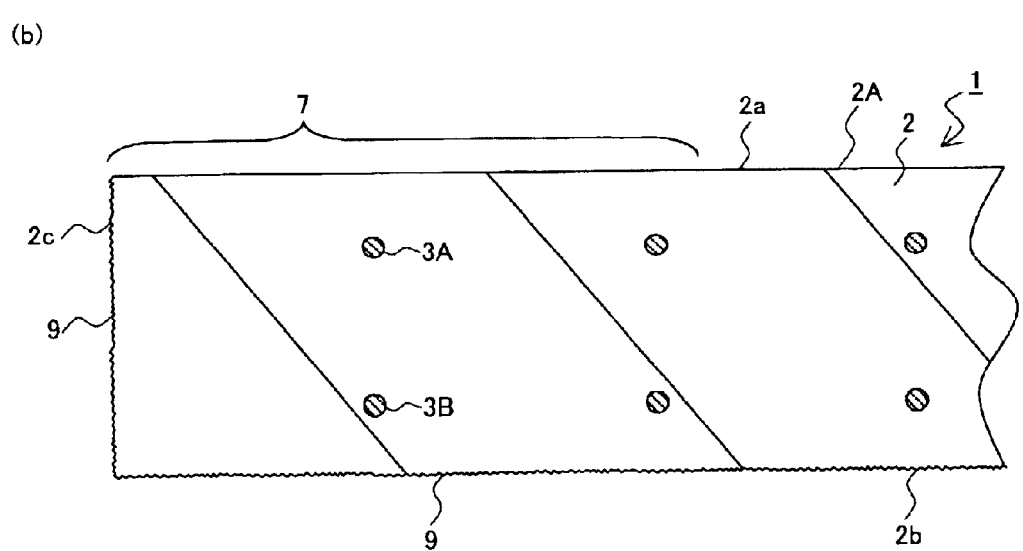

According to one embodiment of the present invention, the temperature distribution on a heating face of a ceramic heater is observed. For example, as shown in FIG. 1, the heater includes a plate-shaped ceramic substrate 2 and heat generators 3A, 3B embedded in the substrate 2. The reference number 2a denotes a heating face, 2b denotes a back face, and 2c denotes a side face. A measuring apparatus 4 is provided over the heating face 2a so that the temperature distribution on the heating face 2a is measured as an arrow "A." The results obtained by the measurement is sent as an arrow "B" to a processor 5 to perform image processing. The result of the image processing is then sent to a display 6 as an arrow "C."

When a cold spot or hot spot out of specification is observed on the heating face 2a, the subsequent steps are performed. For example, as shown in FIG. 2(a), a cold spot 7 is observed on the heating face 2a. As shown in FIG. 2(b), the whole of a side face 2c and a back face 2b of the substrate 2 is rough to a some degree, at this stage.

Figure 8:
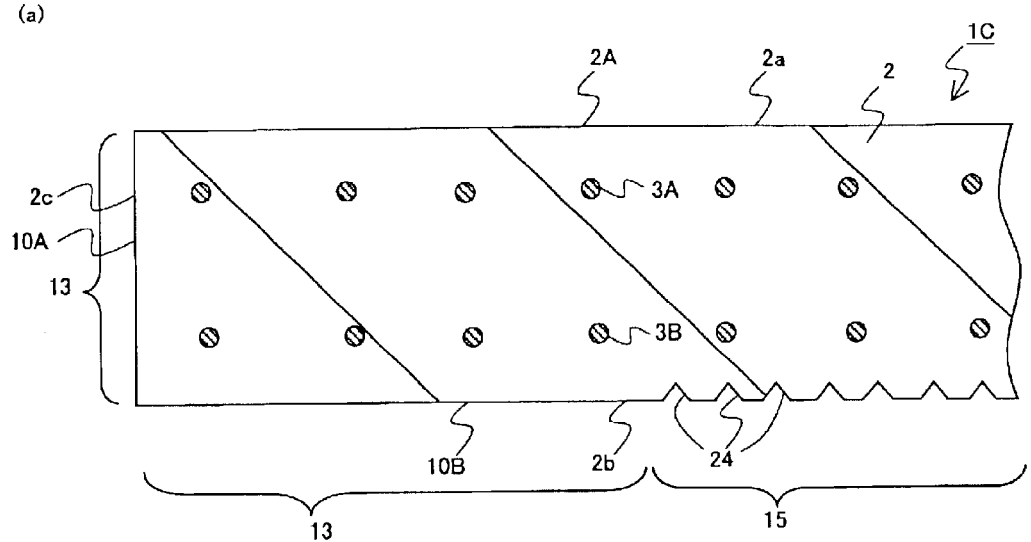
FIG. 8(a) is a cross sectional view showing an essential part of a ceramic heater 1C having a first region 15 with a groove 24 formed therein.
FIG. 8(b) is a cross sectional view showing an essential part of a ceramic heater 1D having a first region 15 with protrusions formed at specified intervals thereon.
Figure 8:
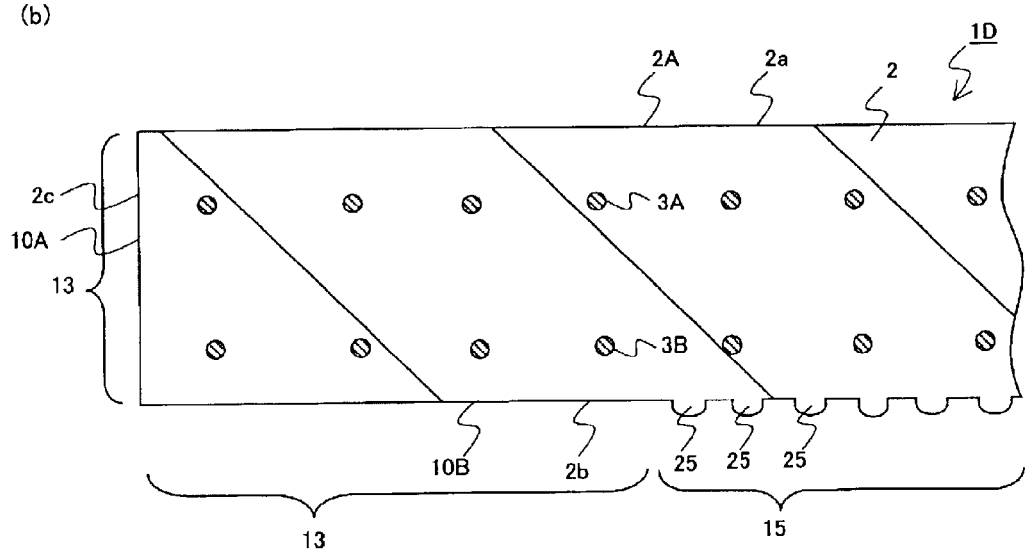

In the present embodiment, a projected area may be defined at least on the back face 2b corresponding with a planar pattern of the cold spot 7. A second region with a smaller center line average surface roughness is provided in the projected area. For example, as shown in FIGS. 3(a) and 3(b), 8 denotes a projected area defined by projecting a planar pattern of the cold spot 7 onto the back face 2b. For providing the second region, for example, the whole of the back face 2b and side face 2c of the heater 1A is subjected to lapping so as to form smoothened surfaces 10A, 10B and 10C each having a smaller center line average roughness.

As shown in FIGS. 4(a) and 4(b), the side face 2c is covered with a mask 12B. The projected area 8 corresponding with the cold spot 7 is also covered with a mask 12A.

The back face 2b of the substrate 2 is then subjected to a treatment for increasing surface roughness. The masks 12A and 12B are then removed to obtain a ceramic heater 1B shown in FIGS. 5(a), 5(b) and 6.

In the heater, the projected area 8 corresponding with the cold spot 7 on the back face 2b is covered with the mask so that the smoothened surface 10B remains. The smoothened surface 10A remains on the side face 2c of the substrate 2 covered with the mask. These smoothened faces 10A and 10B together form a second region 13. The other region without the mask on the back face 2b is made a roughened surface 14, which forms a first region 15 with a larger center line average roughness than the second region 13.

It has been proved possible to reduce or cancel the cold spot, by forming the smoothened surface region 13 with a smaller center line average surface roughness in the projected area on the back face corresponding with the cold spot or on the side face.

Further, it should be noted that a uniform temperature distribution on the heating face may be realized by surface processing the surface of a ceramic substrate itself. Such control of the temperature distribution does not require an outer member (such as a reflector) fixed outside the ceramic substrate, for example, as in the prior art described above.

Particularly, in the present embodiment, two layers of resistance heat generators 3A and 3B are embedded in the ceramic substrate so that the calorific value generated by each heat generator is controlled for performing so-called two zone controlling system. It is possible to apply a multi-zone control system having three or more zones. In the present example, a multi-zone control system, particularly a multi-zone control system using a plurality of layers of heat generators embedded in a ceramic substrate, is applied. The temperature distribution on the heating face may be normally controlled within an order of not more than 10° C., by applying such a multi-zone control system. In an actually manufactured article, a local cold spot or hot spot may be observed due to various reasons, even when the multi-zone control system is performed.

In this case, it may be considered to control the calorific value of a heat generator embedded in a zone where a cold spot or hot spot is observed, so as to cancel the cold or hot spot. Achieving such control, however, has been difficult. The reasons are as follows. When the electric power supply to each of the heat generators is increased or reduced, the calorific value of the heat generator changes. Such a change does not necessarily reduce the temperature distribution on the heating face and may even increase the temperature distribution. The multi-zone heater is effective for controlling the average temperature in each of the outer peripheral zone and inner zone of the heating face. However, a cold spot or hot spot may be observed in only a part of each of the outer peripheral and inner zones of the heating face in a ceramic heater. It is thus difficult to provide a solution for such a cold or hot spot.

The present invention provides a solution for such local hot or cold spot, even on a small order of, for example, not more than 10° C., when uniform temperature distribution has been already realized to some degree by means of the multi-zone control system. It is thus possible to control and accurately adjust the temperature distribution for an individual article.

It is possible to provide a reduced temperature distribution according to the present invention. The control according to the present invention is, however, not limited to such control of reducing the temperature distribution. For example, a region with a higher temperature or a lower temperature with a specific temperature difference may be provided in a specified area on the heating face, according to the present invention.

The emissivity of thermal radiation on the surface of a ceramic substrate may be measured as follows. A ceramic substrate is maintained at a specific temperature and its surface is observed with a thermoviewer to obtain a temperature. The emissivity of thermal radiation is adjusted so that the temperature measured by the thermoviewer becomes identical with a specified temperature for the ceramic substrate.

In the present invention, a plurality of regions having the emissivities of thermal radiation different from each other may be provided on the surface of a ceramic substrate, by controlling the center line average surface roughness, as described above. Alternatively, the regions may be provided according to the following methods.

(1) A recess having a depth of not smaller than 1 μm is formed in a first region by machining. The recess is preferably an elongate recess or groove, and more preferably a V-shaped or U-shaped groove. The depth of the recess is preferably not smaller than 10 μm for further improving the effects of the present invention. The depth is preferably not larger than 1000 μm from the viewpoint of preventing difficulties in the machining process.

(2) A protrusion having a height of not smaller than 1 μm is formed by machining in a first region. Preferably, the protrusion is a so-called emboss or dimple. The height of the protrusion is preferably not smaller than 10 μm for further improving the effect of the present invention. The height is preferably not larger than 1000 μm from the viewpoint of preventing difficulties in the machining process and for preventing adverse effects on the gas flow used for processing.

(3) The first region is subjected to a chemical surface treatment. Such a treatment includes an etching or oxidizing process as described below.

(4) The lightness of the first region is made smaller than that of the second region, so as to increase the emissivity of thermal radiation of the first region. In this case, the difference of the lightness of the first region and that of the second region may preferably be not smaller than 0.5. Further, the lightness of the first region may preferably be N1 to N6, and the lightness of the second region may preferably be N2 to N10.

Lightness will be described below. The surface color of a substance is represented by three properties of color perception: hue, lightness and chroma. Lightness is a property representing a visual perception judging the reflectance of the surface of a substance. The representations of the three properties are defined in "JIS Z 8721." The representation of lightness will be briefly described. The lightness "V" is defined based on achromatic colors. The lightness of ideal black and that of ideal white are defined as "0" and "10," respectively. Achromatic colors between the ideal black and ideal white are divided into 10 categories and represented as symbols from "N0" to "N10." The categories are divided so that each category has a same rate or span in terms of visual perception of lightness. When actually measuring the lightness of a ceramic substrate, the surface color of the substrate is compared with standard color samples corresponding with "N0" to "N10" to determine the lightness of the body. The lightness is determined to the first decimal point, whose value is selected from "0" and "5."

In a preferred embodiment, the difference between the maximum and minimum temperatures on the heating face of the substrate is not more than 20° C. and more preferably not more than 10° C. when an average temperature on the heating face is 600° C. When the average temperature on the heating face is not lower than 600° C., the effect of thermal radiation from a rough surface becomes considerable. As a result, the invention may be effective for further improving the temperature uniformity after the in-plane temperature distribution of an object on the heating face is controlled to be uniform to some degree.

According to one embodiment of the present invention, the ceramic substrate has a surface including at least a heating face and a back face opposing to the heating face. Further, the surface of the substrate may include a side face in addition to the heating and back faces.

In a preferred embodiment, the back face of the substrate is divided into first and second regions. The first region has a larger emissivity of thermal radiation than that of the second region. The temperature on the heating face may be slightly reduced in a first projected area defined by projecting the first region onto the heating face, because the first region has a larger emissivity of thermal radiation. The temperature on the heating face may be slightly increased in a second projected area defined by projecting the second region onto the heating face, because the second region has a smaller emissivity of thermal radiation.

Further, a first or second region may be provided on the side face of the substrate. When a cold spot is observed in the outer peripheral portion of the heating face, the side face may be made the second region having a smaller emissivity of thermal radiation, so that the temperature in the cold spot may be increased to cancel the cold spot. Alternatively, when a hot spot is observed in the outer peripheral portion of the heating face, the side face may be made the first region having a larger emissivity of thermal radiation, so that the temperature in the hot spot may be reduced to cancel the hot spot.

In a preferred embodiment, the temperature distribution on the heating face of the ceramic substrate is observed and the first and second regions are provided based on the observed temperature distribution.

In a preferred embodiment, a cold spot observed on the heating face is projected onto the back face to define a projected area, on which the second region having a smaller emissivity of thermal radiation is provided. Alternatively, a hot spot observed on the heating face is projected onto the back face to define a projected area, on which the first region having a larger emissivity of thermal radiation is provided.

When a cold spot is observed in the outer peripheral portion on the heating face, the second region having a smaller emissivity of thermal radiation is provided on the side face of the substrate. When a hot spot is observed in the outer peripheral portion on the heating face, the first region having a larger emissivity of thermal radiation is provided on the side face of the substrate.

The difference of the center line average surface roughness Ra of the first region and that of the second region is preferably not smaller than 0.05 µm and more preferably not smaller than 0.1 µm from the viewpoint of the effects according to the present invention.

The center line average surface roughness Ra of the first region is preferably not smaller than 0.6 µm and more preferably not smaller than 0.8 µm from the viewpoint of the effects according to the present invention.

The center line average surface roughness Ra of the second region is preferably not larger than 0.6 µm and more preferably not larger than 0.4 µm from the viewpoint of the effects according to the present invention.

The average surface roughness is measured by means of a surface roughness tester.

For providing a difference between the center line average surface roughness of the first region and that of the second region, the following methods may be used:

(1) A part of the surface of the substrate (other than heating face) is subjected to a roughening treatment to provide the first region having a larger roughness and to leave an untreated second region;

(2) A part of the surface of the substrate is subjected to a smoothening treatment to provide the second region having a smaller roughness and to leave an untreated first region; and (3) One part of the surface of the substrate is subjected to a roughening treatment to provide the first region having a larger roughness and the other part of the surface is subjected to a smoothening treatment to provide the second region having a smaller roughness.

The roughening treatment for providing the first region is not limited and may preferably be blasting or etching. The following are particularly preferred conditions.

Sandblast

A blasting material for sandblasting is preferably a ceramic material, such as silicon carbide or alumina. Metals are not preferable because they may be a source of metal contamination. The particle diameter of the blast material is preferably smaller than #180, for reducing damage caused to the surface of the ceramic substrate and the content of residual metal components on the damaged area. The blast nozzle material is preferably a ceramic material. Wet and dry processes are both suitable.

Etching

Wet etching using hydrofluoric acid, hydrochloric acid, nitric acid or ammonia is preferred. Alternatively, dry etching using a halogen gas such as $NF_3$, $Cl_2$ and $ClF_3$ is also preferred.

The smoothening treatment for providing the second region is also not limited and is preferably achieved by a mechanical working process. Such a working process includes lapping and polishing. The following are particularly preferred conditions:

Grinding using diamond grind stones of #800 or more;

Buffing using free abrasive grains (having a particle size of not more that 0.1 µm) such as alumina and colloidal silica grains; and Lapping using diamond abrasive grains having a particle size of not more than 5 µm (the number of revolutions is not smaller than 10 rpm and the pressure is not lower than 100 $g/cm^2$).

The system for observing the temperature distribution on the heating face is not limited and is preferably an infrared thermoviewer, a wafer equipped with a thermocouple, an RTD wafer or a thermocouple. Methods for producing a mask based on the results of image processing of the observed temperature distribution are known.

The material for the substrate is not particularly limited. The material may be a known ceramic material including a nitride ceramic such as aluminum nitride, silicon nitride, boron nitride and sialon, and an alumina-silicon carbide composite material. The material is most preferably aluminum nitride or alumina for providing high anti-corrosion property to a corrosive gas such as a halogen based gas.

The shape of the substrate is not particularly limited, and may preferably be a disk. Pocket shaped parts, emboss-shaped parts, or grooves may be formed on its semiconductor mounting face.

The heater may be produced by any method, which is not particularly limited, and is preferably produced by hot pressing or hot isostatic pressing.

The shape of the resistance heat generator may be a coil, ribbon, mesh, plate or film. The material of the heat generator is preferably a pure metal selected from the group consisting of tantalum, tungsten, molybdenum, platinum, rhenium and hafnium, or an alloy of two or more metals selected from the group consisting of tantalum, tungsten, molybdenum, platinum, rhenium and hafnium. When the substrate is made of aluminum nitride, the material for the heat generator is preferably molybdenum or an alloy of molybdenum. Another resistance heat generator made of a conductive material such as carbon, TiN, TiC or the like may also be used.

Figure 6:
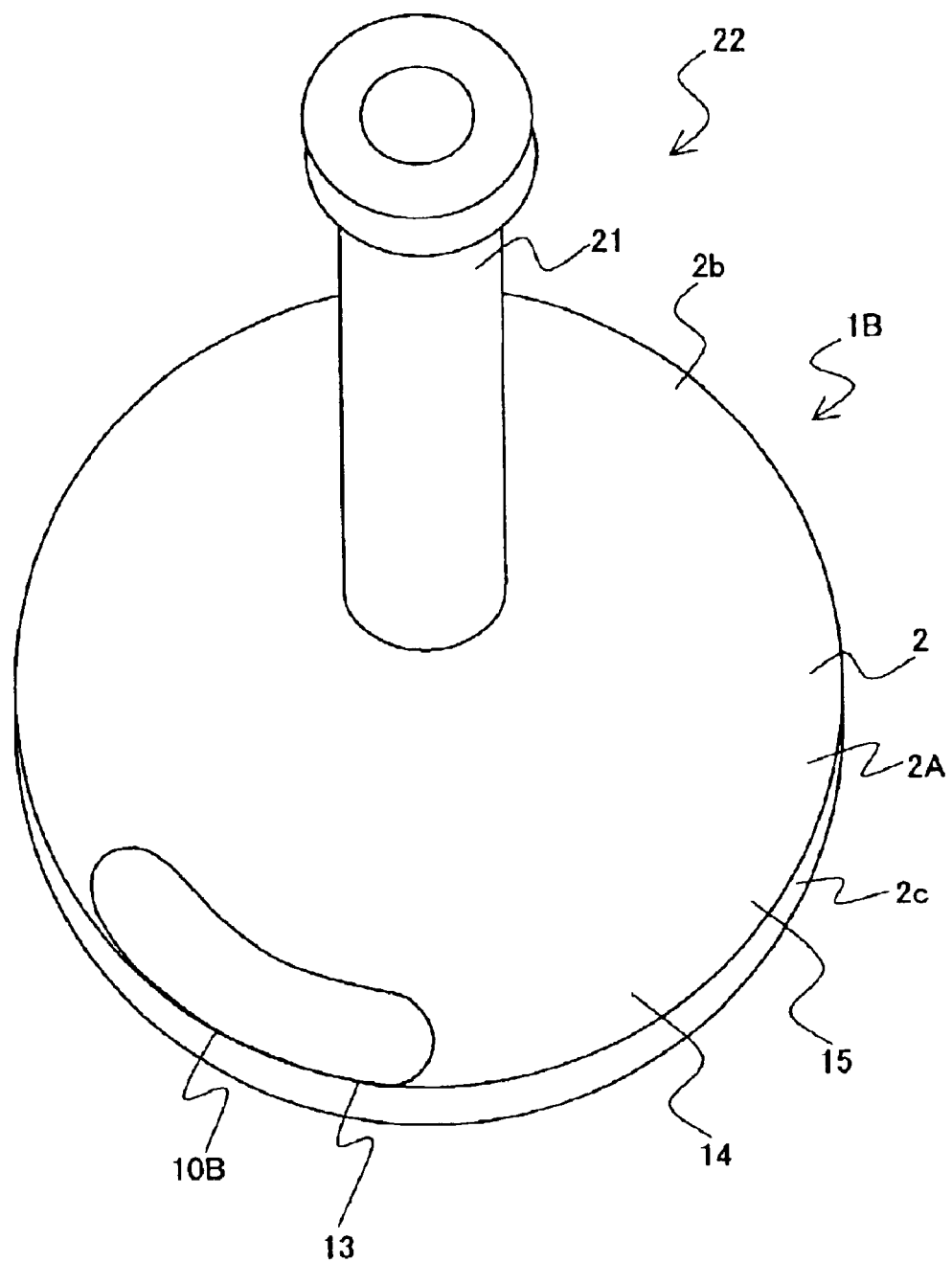
FIG. 6 is a perspective view showing a heating apparatus 22 observed from the side of a back face 2b.
Figure 7:
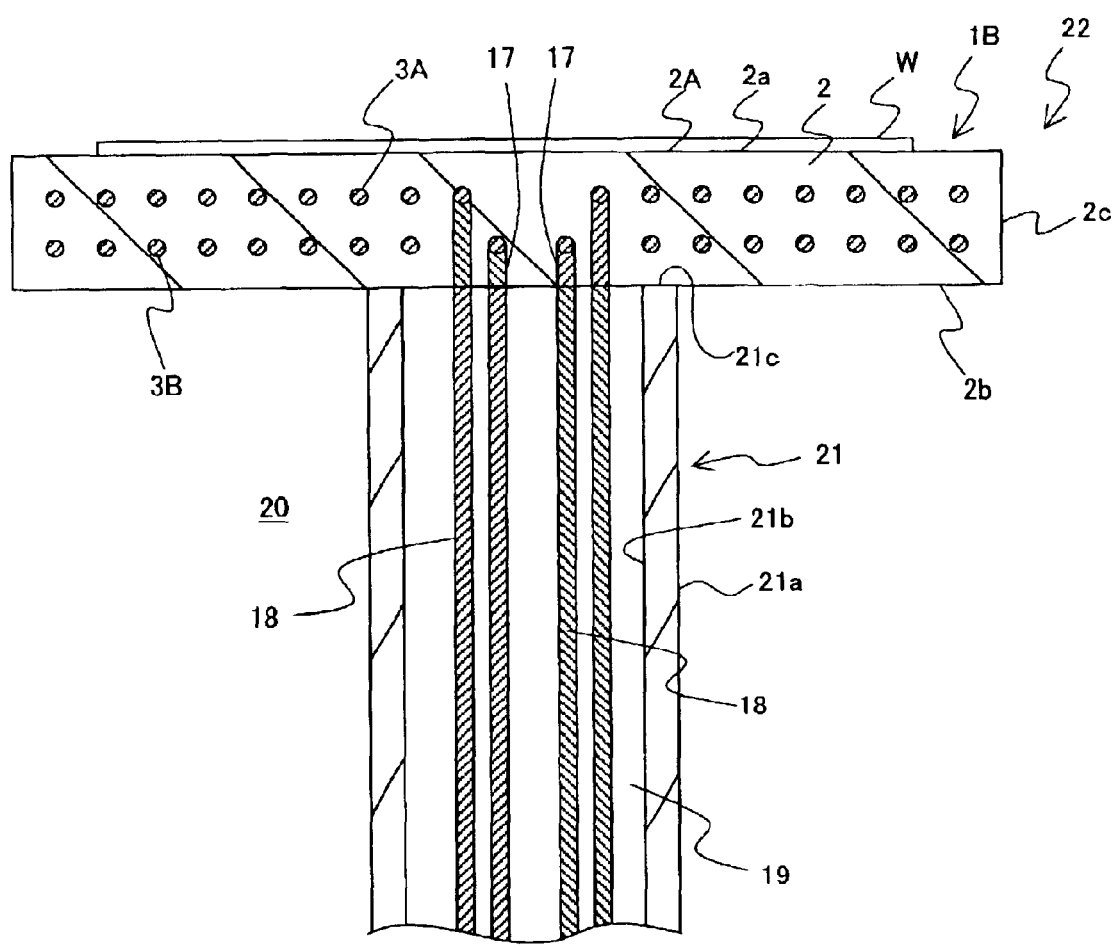
FIG. 7 is a cross sectional view of a heating apparatus 22.

FIG. 6 is a perspective view showing a heating apparatus 22 according to one embodiment of the present invention observed from a back face 2b. FIG. 7 is a cross sectional view showing the heating apparatus 22.

The heating apparatus 22 has a ceramic heater 1B and a supporting member 21. The heater 1B is the same as that shown in FIG. 5. A substrate 2 has a heating face 2a functioning as a semiconductor mounting face for mounting a semiconductor W. One end face 21c of the supporting member 21 is joined with the back face 2b of the heater 1B. The method for joining is not particularly limited. The joining may be carried out by soldering or solid phase welding as described in Japanese patent publication P8-73280A. The heater and supporting member may be joined and sealed using a sealing member such as an O-ring and metal packing.

The supporting member 21 has a cylindrical shape. The supporting member 21 defines an inner space 19 that is separated from atmosphere 20 in a chamber. Power supply means 18 are contained in the inner space 19. One end of the power supply means 18 are connected with the terminals 17. 21a denotes an outer surface and 21b denotes an inner surface of the supporting member 21. The terminals 17 and power supply means 18 are contained in the inner space 19 of the supporting member 21 so that they are prevented from contacting the atmosphere 20 in a semiconductor producing system. It is thereby possible to prevent or reduce the corrosion of the terminals 17 and power supply means 18 so as to prevent metal contamination of a semiconductor.

The material for the supporting member is not limited, and includes a known ceramic material including a nitride ceramic such as aluminum nitride, silicon nitride, boron nitride and sialon, and an alumina-silicon carbide composite material.

The shape of each of the first and second power supply means is not particularly limited, and may be a rod shaped body, a wire shaped body or a combination of rod and wire shaped bodies. The material for the power supply means is not particularly limited. The power supply means are separated from atmosphere 20 in a chamber 19 and thus are not directly exposed to a highly corrosive substance. The material of the supply means is thus preferably a metal, and most preferably, nickel.

Figure 9:
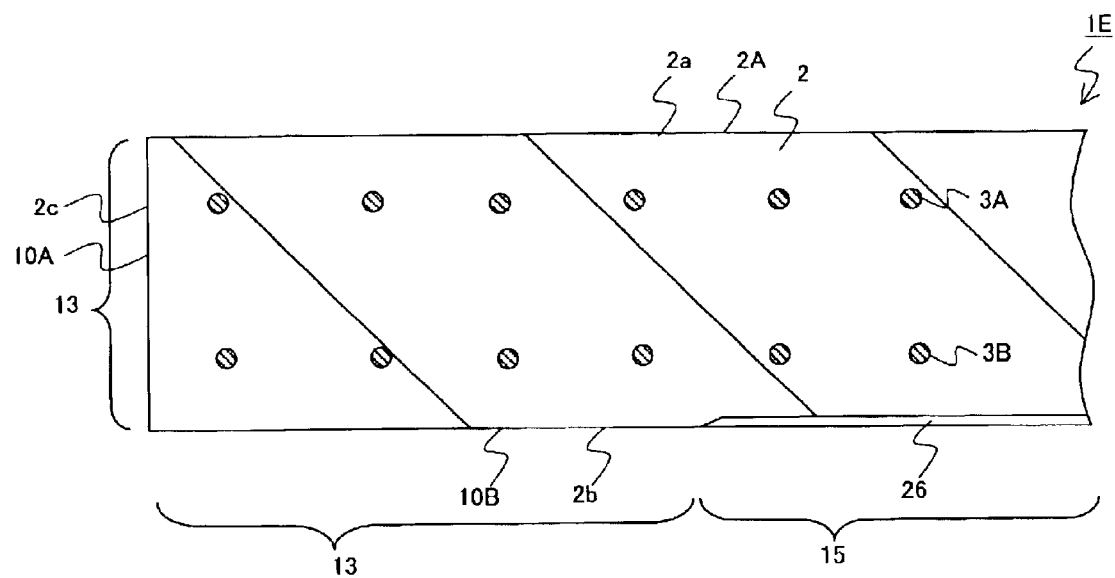
FIG. 9 is a cross sectional view showing an essential part of a ceramic heater 1E.

FIGS. 8(a), 8(b), and 9 are cross sectional views each showing an essential part of each ceramic heater 1C, 1D or 1E according to another embodiment of the present invention.

In the ceramic heater 1C of FIG. 8(a), the second region 13 is a smoothened surface described above. Many V-shaped grooves 24 are formed in parallel with each other at predetermined intervals in the first region 15. The emissivity of thermal radiation from the first region 15 is thereby made larger than that from the second region 13 after the above smoothening treatment.

In a ceramic heater 1D of FIG. 8(b), the second region 13 is a smoothened surface. Many dimple-shaped or emboss-shaped protrusions 25 are formed at predetermined intervals in the first region 15. The emissivity of thermal radiation from the first region 15 is thereby made larger than that from the smoothened second region 13.

In the heater 1E of FIG. 9, the second region 13 is a smoothened surface. In the first region 15, the surface area of the substrate is removed by grinding so that a ground surface 26 is exposed. The ground surface 26 has a lower lightness than those of smoothened surfaces 10A and 10B, so that the emissivity of thermal radiation from region 15 is larger than that from the region 13. When the lightness of the surface of a ceramic substrate is changed by working the surface as described above, the lightness of the substrate surface may be controlled only by working so that the emissivity of thermal radiation may be controlled.

EXAMPLE

A ceramic heater was produced according to the method described referring to FIGS. 1 to 5. The substrate 2 was composed of an aluminum nitride sintered body having a diameter $\phi$ of 250 mm and a thickness of 10 mm. Heat generators 3A and 3B each having a shape of coil spring and made of molybdenum are embedded in the substrate 2. Each terminal was made of molybdenum and was cylindrical in shape.

Figure 10:
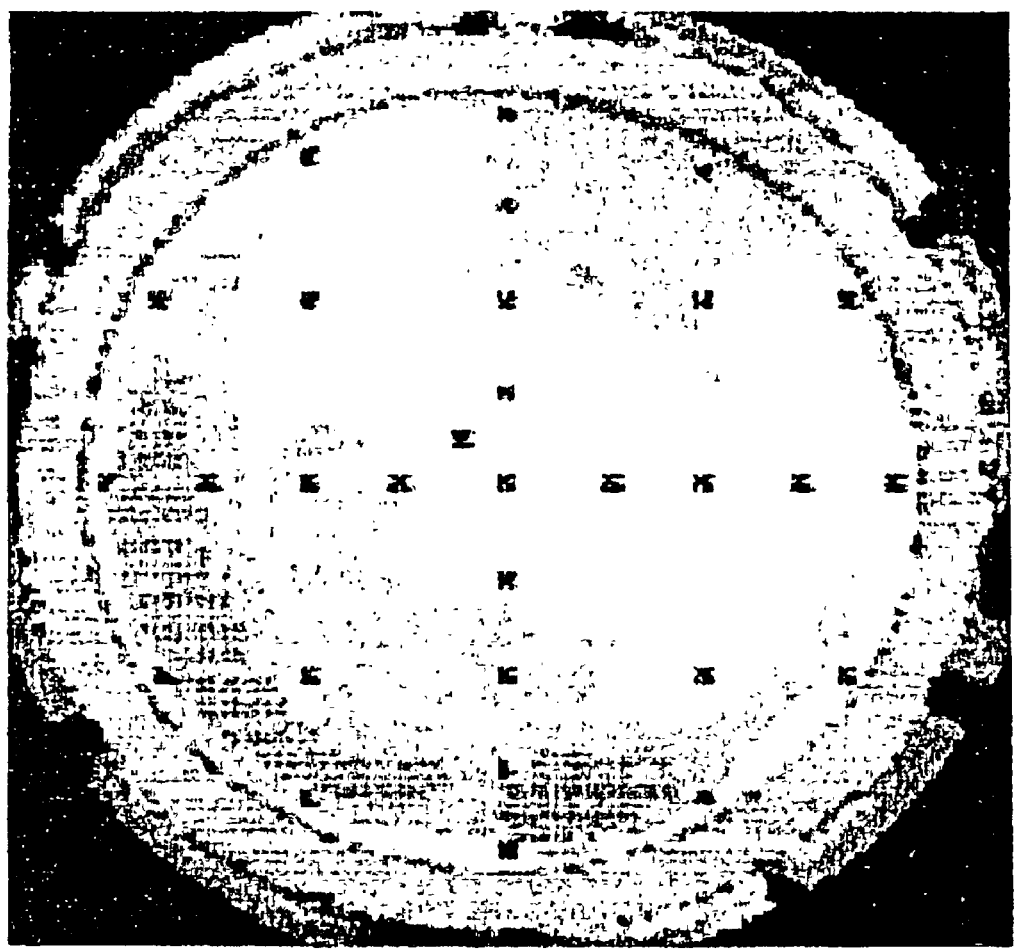
FIG. 10 is an image showing the result of measurement of the temperature distribution on a heating face of a ceramic heater 1 before a treatment.

Power was supplied to the ceramic heater 1 until the average temperature on the heating face 2a reached about 700° C. The temperature distribution on the heating face 2a was then measured by means of a thermoviewer. The results were shown in FIG. 10. As can be seen from FIG. 10, a cold spot 7 having a shape of an arc as shown in FIG. 2(a) was observed. The difference between the maximum and minimum temperatures on the heating face was measured to be 8.5° C.

Figure 3:
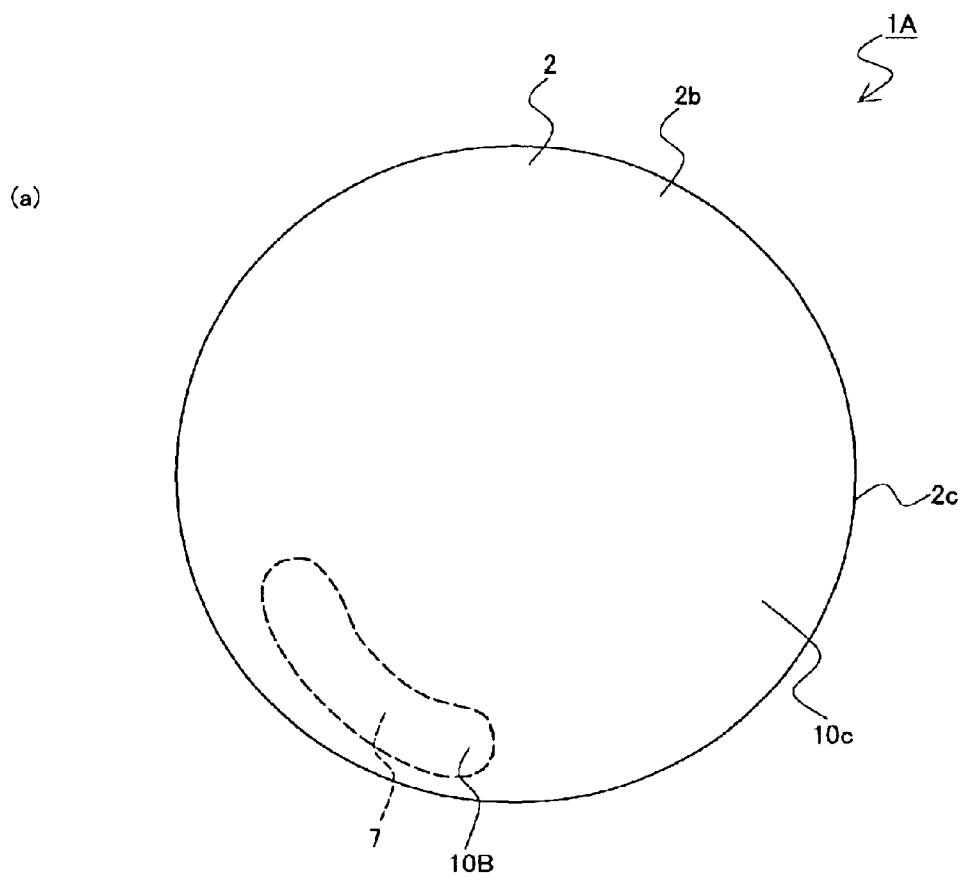
FIG. 3(a) is a bottom view showing a ceramic heater 1A after lapping observed from the side of a back face 2b.
FIG. 3(b) is a cross sectional view schematically showing a proximal part of a side face 2c of the heater 1A.
Figure 3:
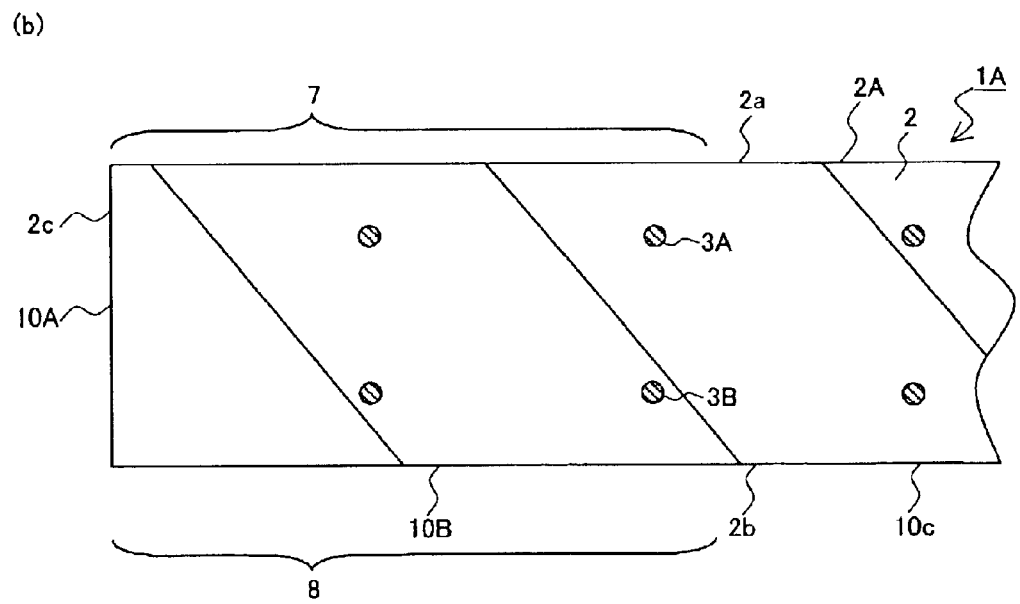

As shown in FIG. 3, the whole of the side face 2c and back face 2b were lapped to provide smoothened surfaces 10A, 10B and 10C, each having a center line average surface roughness of 0.5 $\mu$m.

Figure 4:
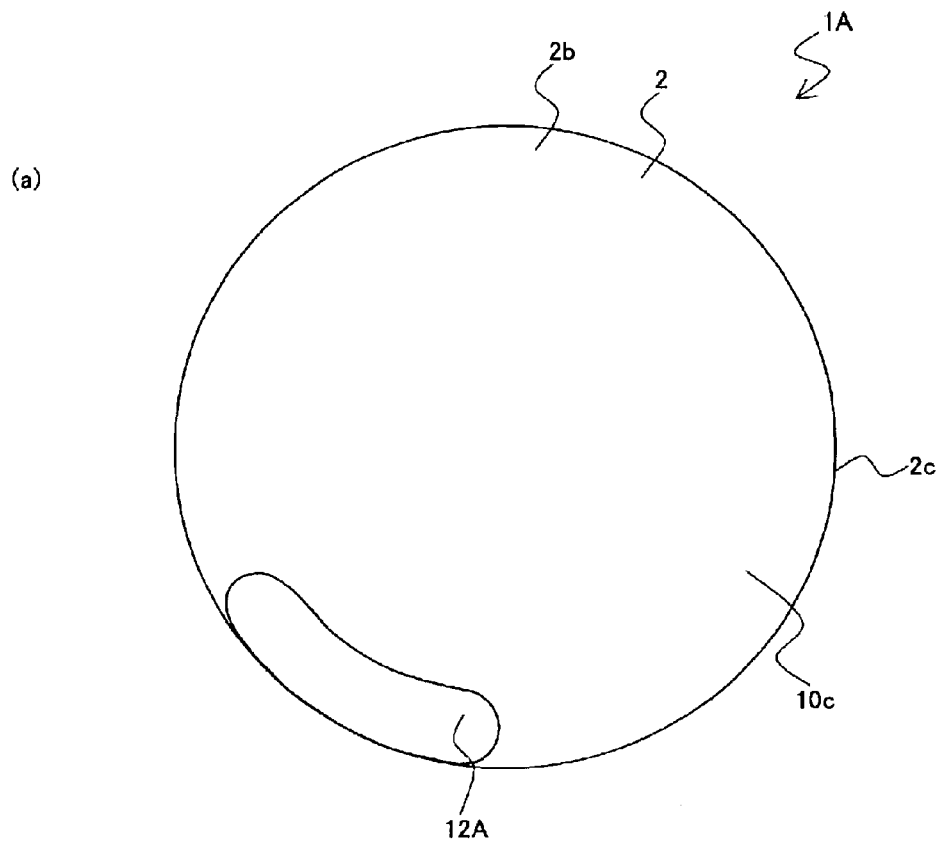
FIG. 4(a) is a bottom view showing the heater 1A with a mask mounted thereon observed from the side of a back face 2b.
FIG. 4(b) is a cross sectional view showing a proximal part of the side face 2c of the heater 1A with a mask mounted thereon.
Figure 4:
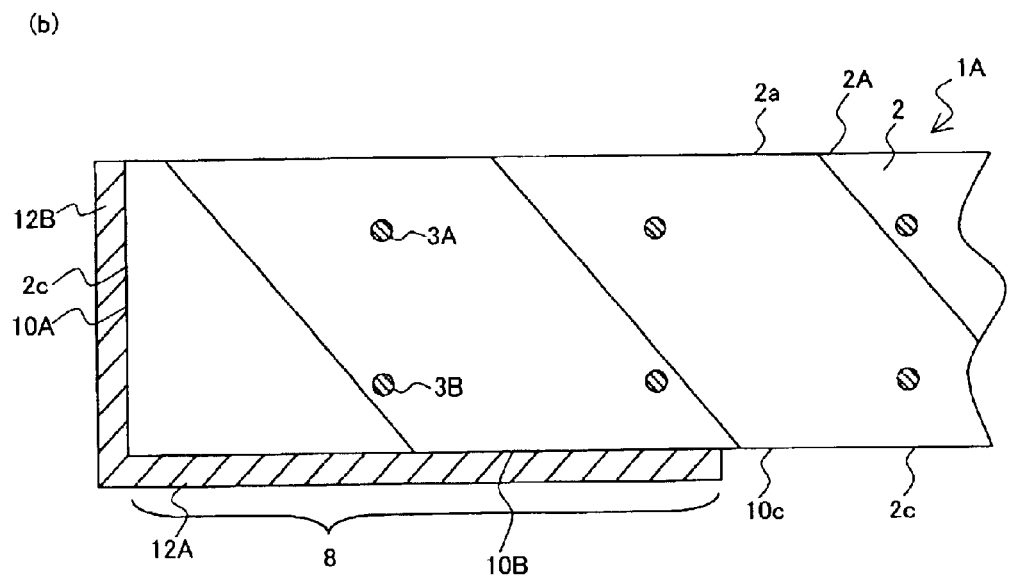
Figure 5:
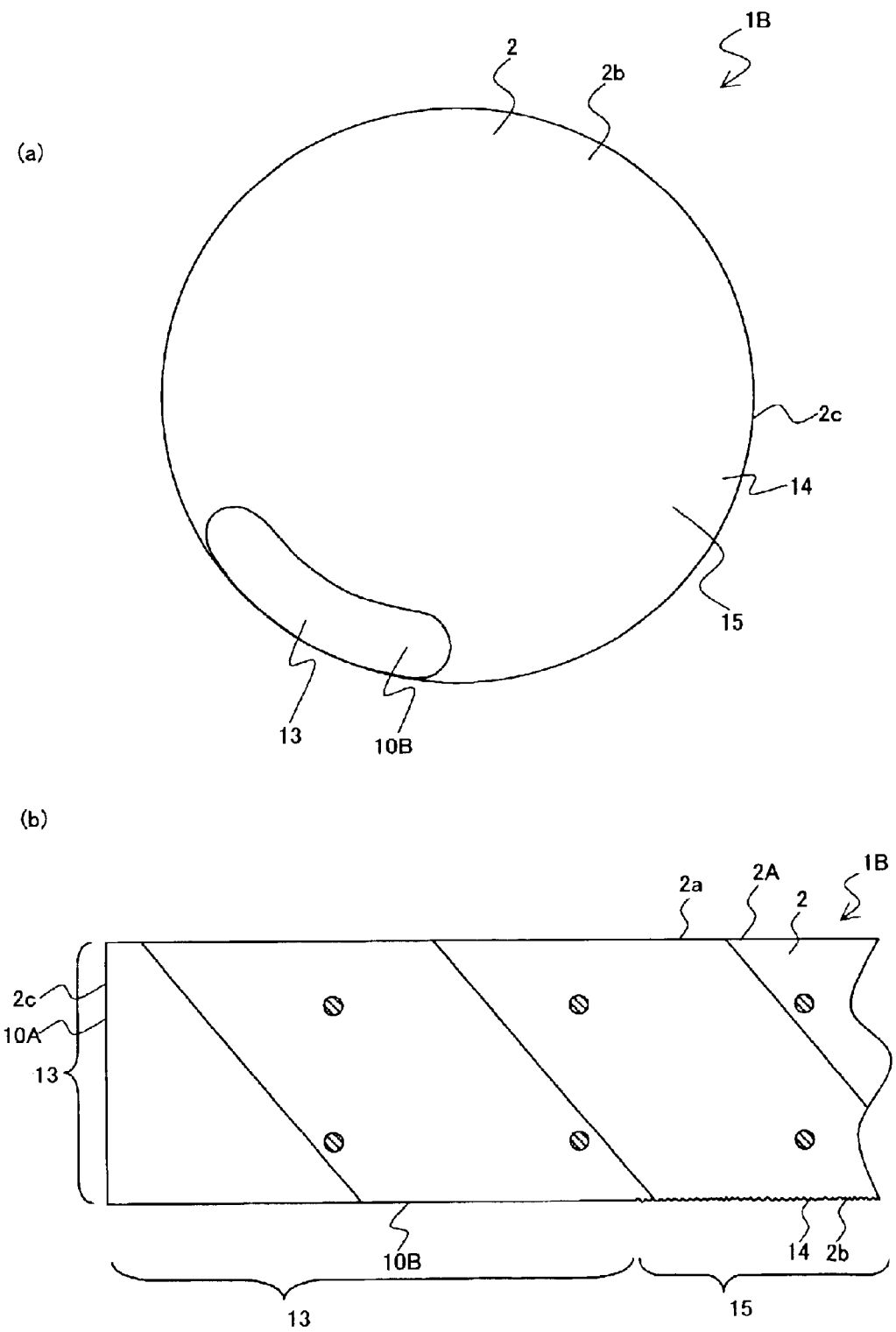
FIG. 5(a) is a bottom view showing a ceramic heater 1B after a roughening treatment observed from the side of a back face 2b.
FIG. 5(b) is a cross sectional view showing a proximal part of the side face 2c of a heater 1B.

Masks 12A and 12B were set as shown in FIG. 4 and the smoothened surfaces were subjected to sandblasting. The masks were then removed to obtain a ceramic heater 1B shown in FIG. 5. The second region 13 has a center line average surface roughness of 0.5 $\mu$m, and the first region 15 has that of 1.0 $\mu$m.

Figure 11:
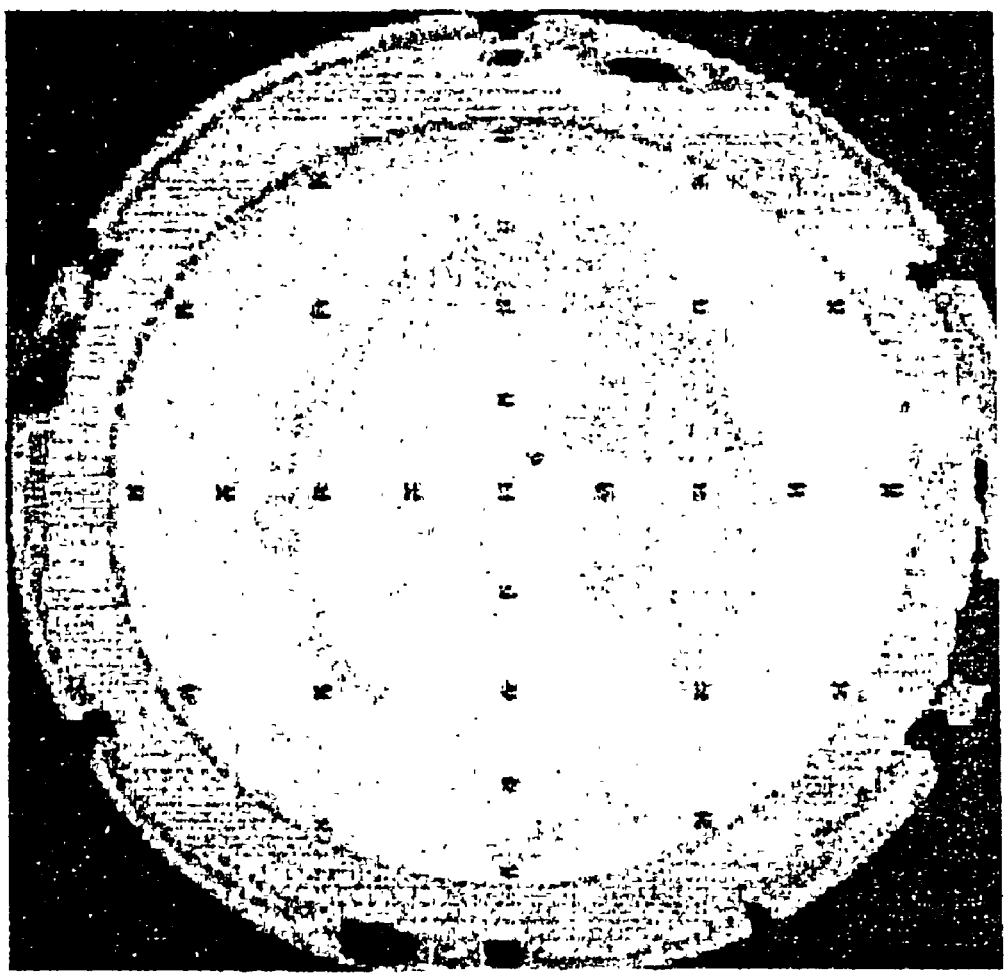
FIG. 11 is an image showing the result of measurement of the temperature distribution on a heating face of a ceramic heater 1B after a treatment.

Power was supplied to the ceramic heater 1B until the average temperature on the heating face 2a reached about 700° C. The temperature distribution on the heating face 2a was then measured by means of a thermoviewer. The results were shown in FIG. 11. As can be seen from FIG. 11, the cold spot 7 shown in FIG. 10 was not observed. The difference of the maximum and minimum temperatures on the heating face was measured and proved to be 4.5° C.

As described above, the present invention provides a novel ceramic heater having a ceramic substrate and a heat generator so that the temperature on the heating face may be controlled without the necessity of a temperature controlling member separate from the substrate.

The present invention has been explained referring to the preferred embodiments. However, the present invention is not limited to the illustrated embodiments which are given by way of examples only, and may be carried out in various modes without departing from the scope of the invention.

What is claimed is:

1. A ceramic heater comprising a heat generator and a ceramic substrate having a surface, said surface including a heating face, an opposed back face, a first region provided on said back face and a second region provided on said back face, wherein said second region has an emissivity of thermal radiation lower than that of said first region.

2. The heater of claim 1, wherein said second region has a center line average surface roughness smaller than that of said first region.

3. The heater of claim 1, wherein said surface further includes a side face, and at least another one of said first and second regions is provided on said side face.

4. The heater of claim 1, wherein at least one of said first and second regions is subjected to a chemical surface treatment.

5. The heater of claim 4, wherein said chemical surface treatment is etching.

6. The heater of claim 1, wherein at least one of said first and second regions is subjected to a physical surface treatment.

7. The heater of claim 6, wherein said physical surface treatment is grinding, lapping, polishing or blasting.

8. The heater of claim 1, wherein said first region has a lightness lower than that of said second region.

9. The heater of claim 1, wherein a difference between the maximum temperature and minimum temperatures on said heating face is not larger than 20° C. when the average temperature on said heating face is 600° C.

10. A heating apparatus for a system for producing semiconductors comprising said heater of claim 1, said heating apparatus further comprising a terminal connected with said heat generator, a hollow supporting member defining an inner space and fixed on said back face of said heater, and a power supply means provided in said inner space and electrically connected with said terminal.

11. A method for producing a ceramic heater comprising a heat generator and a ceramic substrate having a surface including a heating face and an opposed back face, said method comprising the step of providing a first region on said back face and a second region on said back face, wherein said second region has an emissivity of thermal radiation lower than that of said first region.

12. The method of claim 11, further comprising the step of measuring the temperature distribution on said heating face of said heater, wherein said first and second regions are provided based on the measured temperature distribution.

13. The method of claim 12, wherein when a cold spot is detected on said heating face, said second region is provided on said back face in a projected zone defined by projecting the position of said cold spot on said back face.

14. The method of claim 12, wherein when a hot spot is detected on said heating face, said first region is provided on said back face in a projected zone defined by projecting the position of said hot spot on said back face.

15. The method of claim 11, wherein said second region has a center line average surface roughness smaller than that of said first region.

16. A method of adjusting the uniformity of heat emitted from a heating face of a ceramic heater including a heating face and an opposed back face, said method comprising the steps of:
  observing heat emitted from the heating face of the ceramic heater to detect at least one region of heat deviation on the heating face of the ceramic heater; and
  adjusting the emissivity of thermal radiation of a portion of the back face of the ceramic heater that corresponds to said at least one region on the heating face of the ceramic heater.

17. The method of claim 16, wherein said at least one region has a center line average roughness that is smaller than the center line average roughness of at least another region of the back face of the ceramic heater.

18. The method of claim 16, wherein said at least one region has a center line average roughness that is larger than the center line average roughness of at least another region of the back face of the ceramic heater.

19. The method of claim 16, wherein said at least one region is subjected to a chemical surface treatment in said adjusting step.

20. The method of claim 19, wherein said chemical surface treatment comprises etching.

21. The method of claim 16, wherein said at least one region is subjected to a physical surface treatment in said adjusting step.

22. The method of claim 21, wherein said physical surface treatment comprises grinding, lapping, polishing or blasting.

23. The method of claim 16, wherein said at least one region has a lightness that is greater than the lightness of at least another region of the back face of the ceramic heater.

24. The method of claim 16, wherein said at least one region has a lightness that is less than the lightness of at least another region of the back face of the ceramic heater.

* * * * *